United States Patent [19]

Roberts et al.

[11] Patent Number: 4,538,287
[45] Date of Patent: Aug. 27, 1985

[54] FLOATING GATE AMPLIFIER USING CONDUCTIVE COUPLING FOR CHARGE COUPLED DEVICES

[75] Inventors: Charles G. Roberts, Plano; Joseph E. Hall, Richardson, both of

[73] Assignee: Texas Instruments Incorporated, Dallas, Tex.

[21] Appl. No.: 45,466

[22] Filed: Jun. 4, 1979

[51] Int. Cl.³ .................. G11C 19/28; H01L 29/78
[52] U.S. Cl. .................................. 377/60; 357/24
[58] Field of Search ............... 357/24; 307/221 D; 377/57–63

[56] References Cited

U.S. PATENT DOCUMENTS

| | | | |
|---|---|---|---|
| 3,758,794 | 9/1973 | Kosonocky | 357/24 |
| 4,090,095 | 5/1978 | Herrmann | 357/24 |
| 4,104,543 | 8/1978 | Maeding | 357/24 |

OTHER PUBLICATIONS

Wen, "Design and Operation of a Floating Gate Amplifier", IEEE J. Solid-State Circuits, vol. SC-9 (12/74), pp. 410–414.

Primary Examiner—Gene M. Munson
Attorney, Agent, or Firm—William E. Hiller; James T. Comfort; Melvin Sharp

[57] ABSTRACT

A floating gate amplifier in a charge-coupled device (CCD) permitting non-destructive readout, where the floating gate is conductively coupled through a high resistance element to a bias voltage. The floating gate is defined by a lower level of metallization which is embedded in an insulating layer and crosses the charge transfer channel. In one embodiment the floating gate is connected to the source of a metal-oxide-semiconductor transistor and the drain of the transistor is connected to an upper level conductor which is a bias line. In another embodiment, the anode of a diode is connected to the floating gate and the diode cathode is connected to the bias line. A pair of control gates adjacent to and partially overlapping the floating gate transfer charge packets and improve sensitivity. Reading is accomplished by detecting voltages induced on the floating gate by the charge packets.

1 Claim, 12 Drawing Figures

FLOATING GATE AMPLIFIER USING CONDUCTIVE COUPLING FOR CHARGE COUPLED DEVICES

BACKGROUND OF THE INVENTION

This invention is directed to charge-coupled devices, and more particularly, to a floating gate amplifier at the output end of a charge-coupled device permitting non-destructive readout.

Low noise detection and amplification of the signals represented by charge packets in charge-coupled devices (CCD's) are required so that CCD's may be used for low light level or other small signal applications. A non-destructive readout is also desirable to allow further processing of the signal after it is detected. The typical amplifier for detection of charge packets is the precharge amplifier in which a P-N junction is charged to a preset level through an MOS transistor and the signal charge is subsequently allowed to discharge the diode capacitance, thus producing a voltage difference proportional to the signal charge. Unfortunately, the precharge amplifier destroys the charge packet so that it cannot be further processed and produces a noise voltage proportional to $\sqrt{kT/c}$ due to thermal noise in the MOS transistor channel. A floating gate amplifier which provides a non-destructive readout has been described in Wen and Salsbury, Analysis and Design of a Single Stage Floating Gate Amplifier, *ISSCC Dig. Tech. Papers,* Feb. 1973, pp. 154–155 and Wen, Design and Operation of a Floating Gate Amplifier, *IEEE Journal of Solid-State Circuits,* Vol. SC-9, No. 6, Dec. 1974, pp. 410–414. This device also eliminates the preset noise inherent in the preset amplifier. Its structure is such that the floating gate is embedded in an oxide layer underneath a larger bias gate which is used to transfer charge beneath the floating gate. The clocking of the bias gate to transfer charge packets introduces noise on the floating gate, and stresses the insulating oxide because of the large voltages impressed. An improved version of a capacitively coupled floating gate amplifier is disclosed in a copending application, "Capacitively Coupled Floating Gate Amplifier", by Joseph E. Hall, Ser. No. 21,058, filed Mar. 16, 1979. This improved version remotely locates the bias gate and uses control gates to transfer charge packets thereby improving device sensitivity and eliminating some of the noise on the floating gate. However, in all of these structures, there is no conductive connection to the floating gate. Control of the potential on the floating gate tends to be uncertain such that the potential exhibits a tendency to drift with time due to charge migration in the surrounding insulator. This drift changes the operating point of the amplifier and the CCD channel potential.

SUMMARY OF THE INVENTION

The present invention is embodied in a floating gate amplifier for a charge-coupled device which provides a nondestructive readout. The floating gate is defined by a lower level of metallization which is embedded in an insulating layer and crosses the charge transfer channel. In one embodiment, the floating gate is connected to the source of a metal-oxide-semiconductor transistor and the drain of the transistor is connected to an upper level conductor which is a bias line. In another embodiment, the anode of a diode is connected to the floating gate and the diode cathode is connected to the bias line. An upper level of metallization provides a pair of control gates which are adjacent to and partially overlap the floating gate where it crosses the charge transfer channel. Charge packets are transferred beneath the floating gate by use of the control gates which also hold the charge packet beneath the floating gate during the "read" operation improving device sensitivity. The charge induces a voltage on the floating gate which is detected and amplified. The output of the amplifier is proportional to the charge beneath the floating gate. By conductively coupling the floating gate through a high resistance path to a bias line, long term drift of the set point of the floating gate is substantially eliminated in the floating gate amplifier as constructed in accordance with the present invention.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION OF THE DRAWINGS

Figure 1:
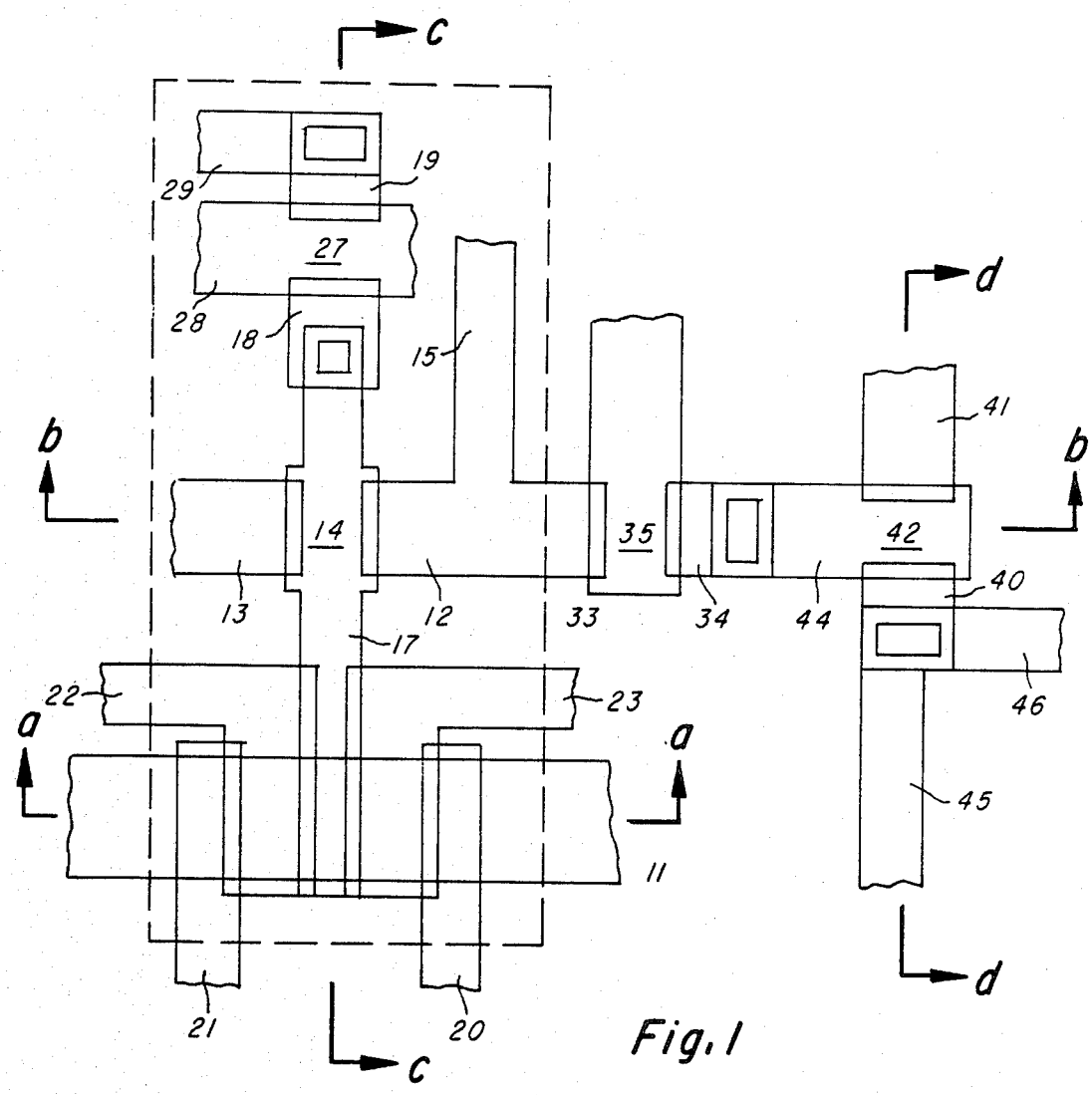
FIG. 1 is a greatly enlarged plan view of a small portion of a semiconductor chip showing the physical layout of a charge-coupled device floating gate amplifier.
Figure 2A:
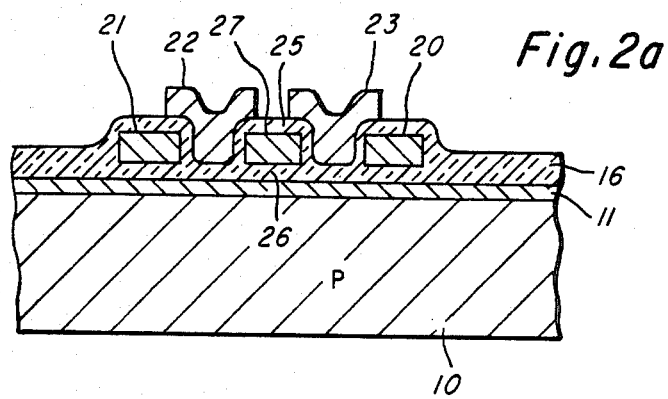
FIGS. 2a–2d are cross-sectional views of the amplifier of FIG. 1, taken along the lines a—a, b—b, c—c and d—d respectively.
Figure 2B:
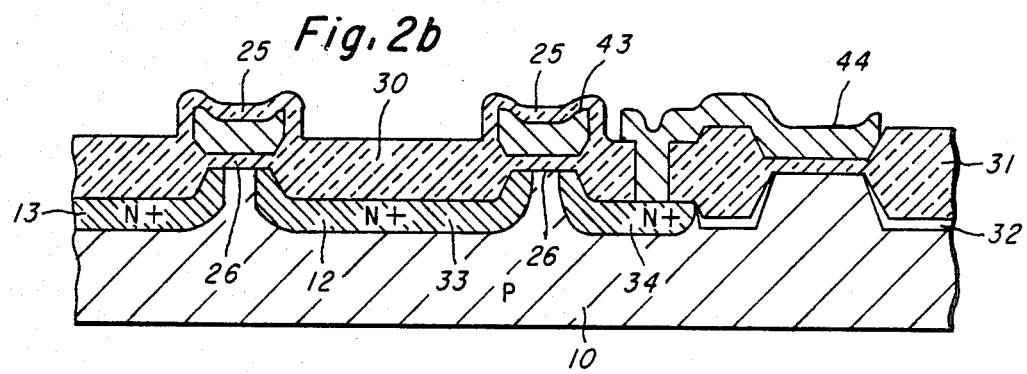
Figure 2C:
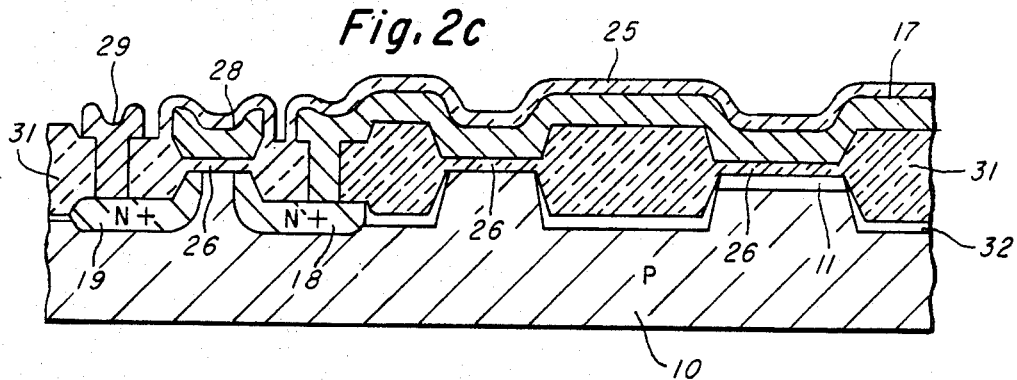
Figure 2D:
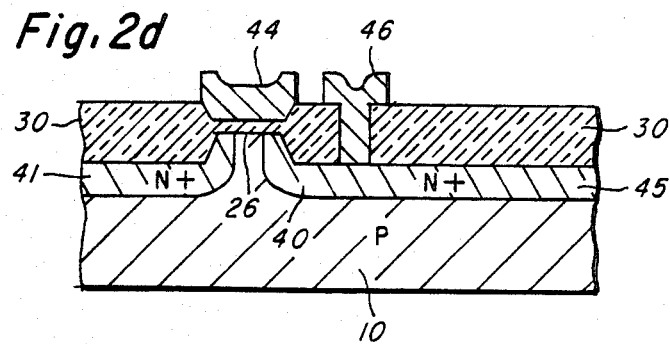

Referring to FIGS. 1 and 2a–2d, a floating gate amplifier at the output end of a charge-coupled device as constructed in accordance with the present invention is shown. The actual floating gate amplifier is contained within the dashed line of FIG. 1 with other output circuitry outside the line. The floating gate amplifier is formed in a substrate 10 of semiconductor material of one conductivity type, preferably p-type silicon, although n-type silicon and other semiconductor materials may be used. A buried charge transfer channel 11 is formed in the substrate 10 by an implant of the other conductivity type and lies parallel to the substrate surface. A pair of diffused regions 12, 13 of a conductivity type opposite that of the substrate 10 are formed in the substrate 10 adjacent to the charge transfer channel 11 and form the source 12 and drain 13 of an output transistor 14. A load resistor 15 is provided in the substrate 10 and is part of the same diffused region 12 which is the source of the output transistor 14. A body 16 of insulating material, preferably silicon oxide, lies on the substrate surface above the charge transfer channel 11. It will be understood that in the fabrication process, the insulating body 16 will be formed in more than one process step. A member 17 of conductive material which may be termed a floating gate electrode in the insulating body 16 and extends transversely across the channel 11. In a preferred embodiment, the conductive member 17 may be aluminum, and it will be understood that in that case part of the insulating body 16 may be anodized aluminum. Other materials such as polycrystalline silicon could be used however in place of aluminum. The floating gate 17 also forms the gate of the output transistor 14. A pair of conductive phase electrodes 20, 21 are embedded in the insulating body 16 on opposite sides of the floating gate and extend transversely across the channel 11. A pair of parallel spaced control gates 22, 23 of conductive material extending transversely across the channel 11 are disposed on the insulating body 16 and partially overlap the floating gate 17 and the phase electrodes 20, 21. A pair of diffused regions 18, 19 of a conductivity type opposite that of the substrate 10 are formed in the substrate 10 remote from the charge transfer channel 11 and form the source 18 and drain 19 of a floating gate bias transistor 27. The floating gate 17 is connected to the source of the floating gate bias transistor 27 via a contact window in the oxide layer 30 above the source 18. A conductive member 28, preferably of aluminum, is embedded in the insulating layer 16 and forms the gate of the floating gate bias transistor 27. A bias line 29, preferably of aluminum, is connected to the drain 19 of the floating gate bias transistor 27 via a contact window in the oxide layer 30 above the drain 19. The conductive member 28 also serves as a control pulse line. A layer 30 of silicon oxide covers the sources 12, 18 and drains 13, 19 of the output transistor 14 and the floating gate bias transistor 27, and the load resistor 15. Thick field oxide regions 31 are provided above channel stops 32 of the same conductivity type as the substrate 10 so as to surround elements of the amplifier.

The source 12 of the output transistor 14 is the output of the floating gate amplifier and also forms the drain 33 of a sample and hold transistor 35. The source 34 of the sample and hold transistor 35 and the source 40 and drain 41 of a sampled output source follower transistor 42 are diffused regions of the same conductivity type as the diffused regions comprising the source and drain areas 12, 13 of the output transistor 14. A conductive strip 43, preferably of aluminum, is embedded in the insulating body 16 and forms the gate of the sample and hold transistor 35. The strip 43 is formed at the same time and of the same material as the floating gate 17. Another conductive strip 44, preferably of aluminum, is connected to the source 34 of the sample and hold transistor 35 via a contact window in the oxide layer 30 above the source 34, and it also forms the gate of the sampled output source follower transistor 42. The gate 44 overlies the lower part 26 of the insulating body 16 which forms the gate oxide 26 for all the transistors. Another load resistor 45 is provided in the substrate 10, the load resistor 45 being part of the same diffused region 40 which is the source of the sampled output source follower transistor 42. A conductive member 46, preferably aluminum, is connected to the source 40 of the source follower transistor 42 via a contact window in the oxide layer 30 above the source 40. The member 46 is formed of the same material and at the same time as the control gates 22, 23 and is the output from the output circuitry.

In fabricating the floating gate amplifier, it will be understood that suitable processing techniques well known in the semiconductor industry may be used.

Figure 3:
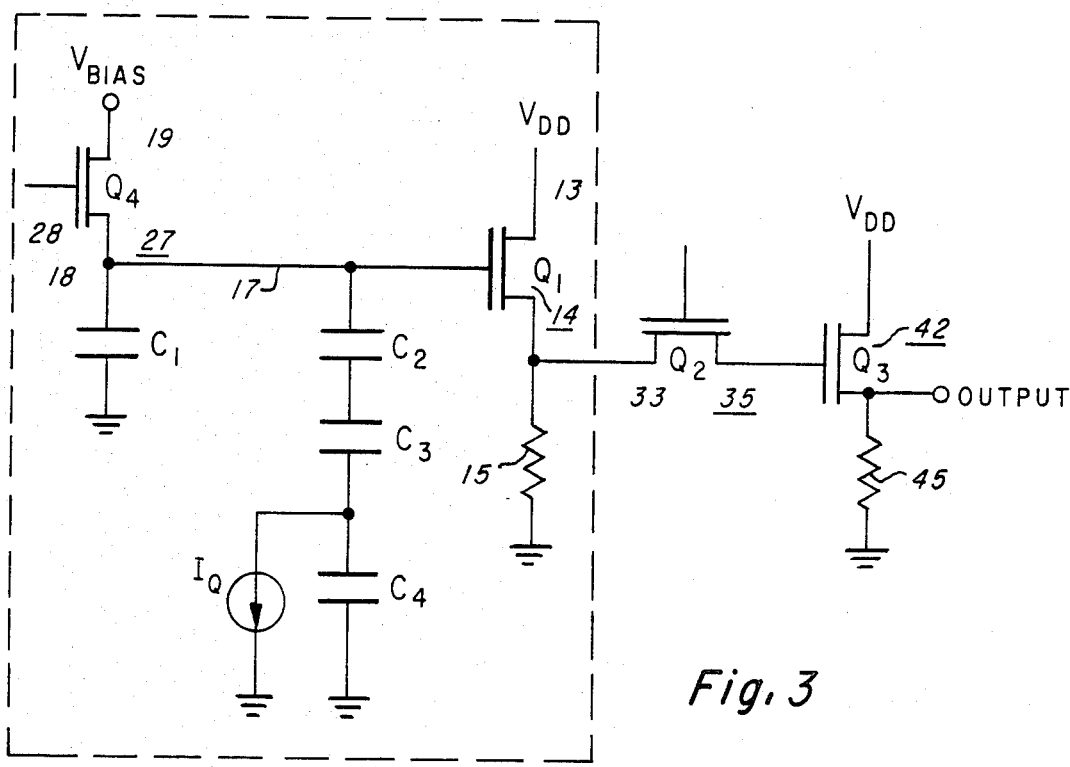
FIG. 3 is an electrical schematic of the floating gate amplifier of FIG. 1 and other output circuitry, the floating gate amplifier being shown within dotted lines.

FIG. 3 is an electrical schematic of the floating gate amplifier of FIG. 1 along with other output circuitry, the floating gate amplifier being shown within a dashed line rectangle. The floating gate amplifier comprises an MOS floating gate bias transistor 27, an MOS output transistor 14, a floating gate 17 and a load resistor 15. The floating gate bias transistor 27 has a drain 19 which is connected to a bias voltage, a source 18 which is connected to the floating gate 17 and a gate 28 which is the control pulse line 28. The output transistor 14 has a drain 13 connected to $V_{DD}$, a source 12 connected to a load resistor 15 and the drain 33 of the sample and hold transistor 35, and a gate 17 which is also the floating gate 17. In addition to the aforementioned elements, there are included within the amplifier schematic a current source $I_Q$ and a plurality of capacitors $C_1$, $C_2$, $C_3$, $C_4$. The current source $I_Q$ is representative of the movement of a charge packet into a potential well beneath the floating gate 17. Capacitor $C_1$ is representative of the stray capacitance between the floating gate 17 and ground. Capacitor $C_2$ is representative of the capacitance of the gate oxide between the floating gate and the silicon. Capacitor $C_3$ is representative of the capacitance of the depleted silicon region between the surface of the silicon and the charge in the well. Capacitor $C_4$ represents the capacitance between the charge in the potential well and the silicon bulk substrate for buried channel CCD's. These capacitances control the ability of the well to hold charge.

In a CCD device, information is stored in the storage wells of the device. To "read" what is stored in the wells, the charge in each well must be transferred to a location where it can be "read" and amplified. Here it is transferred to a storage well beneath the floating gate 17 which is an element in the floating gate amplifier. The floating gate amplifier is a non-destructive read-out amplifier such that the charge packet in the well is not destroyed when the information is read. The floating gate is a key feature of the amplifier. It is the gate of the MOS output transistor 14, and it is connected to the source 18 of the floating gate bias transistor 27. The voltage on the floating gate is first set by turning on the floating gate bias transistor 27 by raising the voltage on the control pulse line 28 as shown in the CP waveform in FIG. 4 at 67. This raises the voltage on the floating gate 17 to $V_{preset}$, the voltage on the control pulse line 28 minus the threshold voltage of the floating gate bias transistor 27. Then, the voltage on the control pulse line 28 is lowered to turn off the floating gate bias transistor 27 as shown in the CP waveform in FIG. 4 at 68. This sets the voltage on the floating gate 17, sets the operating point of the output transistor 14, and prevents floating gate bias transistor 27 from being turned on when a large charge packet is transferred beneath the floating gate 17. This also isolates the bias voltage from the floating gate 17 and the output transistor 14. When a charge packet is transferred into the storage well beneath the floating gate 17, it induces a voltage on the floating gate 17, temporarily changing the voltage that was just set. The voltage induced is proportional to the amount of charge in the charge packet. This induced voltage changes the current through the output transistor 14 and therefore can be detected and amplified. This operation can be demonstrated by referring to FIG. 3, the equivalent circuit of the floating gate amplifier. The current source $I_Q$ represents the amount of current in a charge packet that is transferred to the storage well beneath the floating gate 17. As such it is not continuous but only a pulse of current. The value of $I_Q$ will vary with the amount of charge in each charge packet. When current flows in $I_Q$, electrons are being placed in the capacitors $C_3$ and $C_4$ which causes a change in the voltage on the floating gate 17 when the charges are redistributed among the capacitors. This change in floating gate voltage changes the operating point of the output transistor 14 and changes the signal from the load resistor 15, the output of the floating gate amplifier. Since the floating gate amplifier output is proportional to the amount of charge in a charge packet, this mode of operation is useful for CCD imagers.

Figure 4:
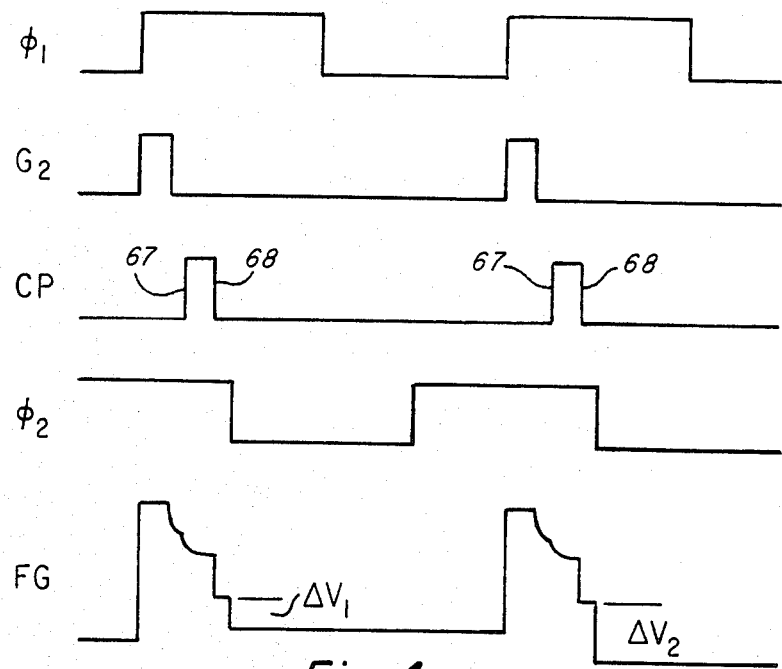
FIG. 4 is a diagrammatic view showing a clocking sequence for operation of the floating gate amplifier.
Figure 5:
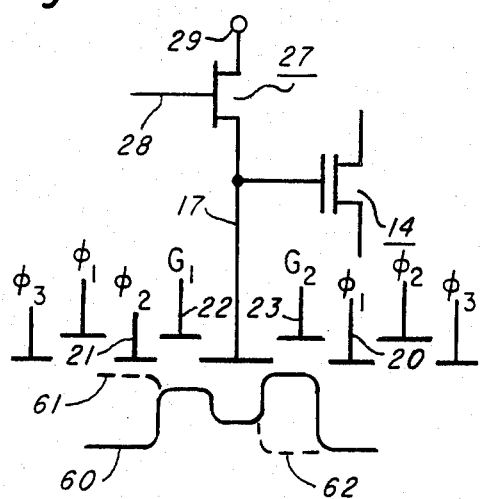
FIG. 5 is a potential diagram for the CCD in the vicinity of the floating gate.

The operation of the floating gate amplifier in conjunction with the rest of the CCD can be understood by referring to FIGS. 4 and 5. FIG. 4 represents the voltages that are applied to or appear on some of the gates 17, 22, 23 and phase electrodes 20, 21 of FIG. 5. The solid line 60 beneath the gates 17, 22, 23 and phase electrodes 20, 21 in FIG. 5 indicates the potential in the wells during a typical "read" operation. The dotted lines 61, 62 represent the potentials when different voltages are applied to the respective phase electrodes and gates. Assume there is a charge packet in the storage well beneath the $\phi_2$ phase electrode 21 which is to be "read". First, the charge packet in the storage well beneath the floating gate 17 must be transferred to another storage well. This is accomplished by raising the voltage on the output control gate ($G_2$) 23 for a period of time $\tau_1$ and letting the charge packet beneath the floating gate 17 transfer to the well beneath the $\phi_1$ phase electrode 20. When the voltage on control gate $G_2$ is raised, the potential underneath it is represented by the dotted line 62. After the charge packet is transferred to the well beneath the phase electrode $\phi_1$ 20, the voltage on the control gate $G_2$ is brought back to ground. Next, the charge packet beneath the $\phi_2$ phase electrode 21 must be transferred to the well beneath the floating gate 17 to be "read". This is accomplished by bringing the voltage on the $\phi_2$ phase electrode 21 to ground. This causes the charge packet beneath the $\phi_2$ phase electrode 21 to transfer to the well beneath $G_1$, the input control gate 22. However, since the potential under the floating gate 17 is lower than the potential under control gate $G_1$ the charge packet will "fall" into the well under the floating gate 17. It will go no further because the potential under control gate $G_2$ is higher than the potential under the floating gate 17. The transfer of the charge packet will induce a different voltage on the floating gate 17 and the output voltage will change proportionally. This induced voltage can be seen in the changes $\Delta V_1$, $\Delta V_2$ in the FG waveform in FIG. 4. As stated earlier, the voltage changes $\Delta V_1$, $\Delta V_2$ will vary with each charge packet. After each charge packet is "read", the voltage on the floating gate 17 is reset in the manner previously described. With the present invention, charge packets are transferred to and away from the floating gate 17 by using the control gates 22, 23. The input control gate 22 is held at about 1.5 volts and the output control gate 23 is pulsed between $V_{DD}$ and 0 volts. The voltage on the input control gate 22 will not be a barrier to the transfer of a charge packet from the storage well under the $\phi_2$ phase electrode 21 when the electrode voltage is 0 volts, yet it is a barrier to the transfer of any charge under the floating gate 17 back toward the $\phi_2$ phase electrode 21. When the output control gate 23 is at 0 volts, it is a barrier to the transfer of a charge packet from beneath the floating gate 17 to the $\phi_1$ phase electrode 20. Yet when the output control gate 23 is at $V_{DD}$, it will allow charge to be transferred from the well beneath the floating gate 17 to the $\phi_1$ phase electrode 20. The floating gate bias transistor 27 enables effective control over the floating gate potential to be achieved. The floating gate 17 is conductively coupled to the bias line 19 through the high resistance of the floating gate bias transistor 27 when it is in the "off" state. Consequently, the floating gate 17 stays at about a constant potential, $V_{preset}$, the voltage on the control pulse line 28 minus the threshold voltage of the floating gate bias transistor 27. The RC time constant determined by the capacitance of the floating gate 17 and the high resistance of the "off" state floating gate bias transistor 27 is so large that potentials can be induced on the floating gate 17.

Figure 6:
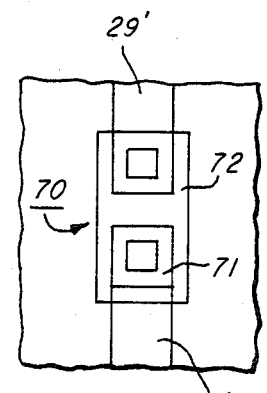
FIG. 6 is a fragmentary view showing a modification of a portion of the floating gate amplifier of FIG. 1, wherein the floating gate bias transistor has been replaced with a diode.
Figure 7:
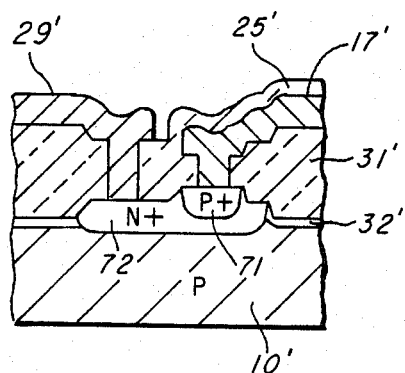
FIG. 7 is a fragmentary view of a modified portion of the cross-sectional view of FIG. 2c showing the modification of FIG. 6 wherein the floating gate bias transistor has been replaced with a diode.
Figure 8:
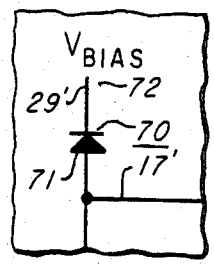

In another embodiment of the invention as illustrated in FIGS. 6–9, a diode 70 replaces the MOS floating gate bias transistor 27 of the embodiment shown in FIG. 1. The anode 71 of the diode is connected to the floating gate 17' and the cathode 72 is connected to a bias line 29' as shown in FIG. 6. The cathode 72 is a diffused region in the substrate 10' of the same conductivity type as the source and drain regions 12', 13' of the output transistor 14'. The anode 71 is a diffused region in the cathode 72 of a conductivity type opposite that of the cathode 72. The floating gate 17 is connected to the anode 71 via a contact in the oxide layer above the anode 71. The bias line 29' is connected to the cathode 72 via a contact in the oxide layer 73 above the cathode 72. Thick field oxide regions 31' are provided above channel stops 32' of the same conductivity type as the substrate surrounds the cathode 72. It will be understood that the primed numbers in FIGS. 6–8 refer to the same numbered unprimed elements in previous figures.

Figure 9:
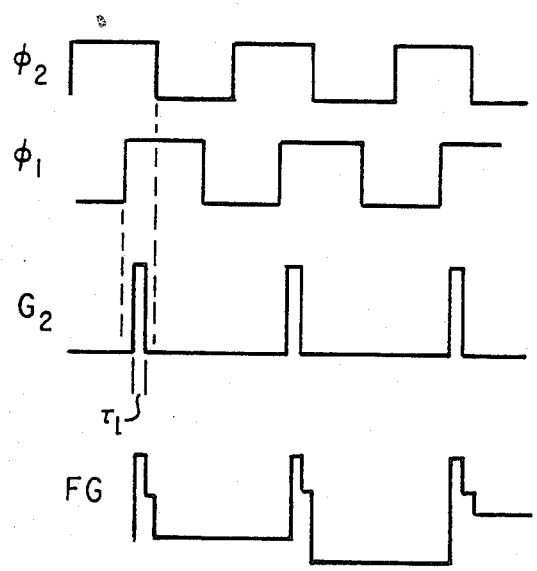
FIG. 9 is a diagrammatic view showing a clocking sequence for operation of the modified floating gate amplifier of FIG. 6.

Charge packets are "read" in the same manner as was previously described with the floating gate bias transistor 27. However, since there is no control pulse line 28, there is no resetting of the voltage on the floating gate 17. This can be seen by examining the clocking sequence of the floating gate amplifier using the diode embodiment as shown in FIG. 9. The voltage on the floating gate 17 is set to the voltage on the bias line 29 by the leakage current through the reverse biased diode 70. Current flows until the floating gate 17 is charged up to the voltage $V_{bias}$ on the bias line 29. The voltage on the floating gate 17 stays set at $V_{bias}$ because of the conductive coupling of the floating gate 17 to the bias line 29 through the resistance of the reverse biased diode 70. The only time the floating gate voltage changes is during the transient periods when charge packets are transferred to and from the well beneath the floating gate 17. The RC time constant of the floating gate capacitance and the resistance of the reverse biased diode 70 is so great that it does not prevent voltages from being induced on the floating gate 17.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications of embodiments as fall within the true scope of the invention.

What is claimed is:

1. A charge-coupled device comprising:

a substrate of semiconductor material of one type conductivity and having a first surface;

means defining a charge transfer channel extending along said first surface of said substrate;

a body of insulating material disposed on said first surface of said substrate;

first and second phase electrodes embedded within said insulating body and extending transversely across said channel in spaced relationship;

a floating gate electrode embedded within said insulating body between said phase electrodes and extending transversely across said channel in spaced relationship with respect to said first and second phase electrodes;

a pair of parallel spaced conductive control gates disposed on said insulating body in overlying relation to said channel, each of said control gates partially overlying said floating gate electrode and a respective one of said first and second phase electrodes but spaced therefrom by insulating material of said insulating body;

first and second regions of the other type conductivity disposed in said substrate in spaced relationship and adjacent to said channel;

said floating gate electrode extending between said first and second regions of the other type conductivity and cooperating therewith to define a transistor wherein the first and second regions of the other type conductivity form the source and drain and said floating gate electrode is the gate thereof;

an elongated conductive member defining a bias line disposed on said insulating body and overlying said substrate at a location remote from said channel;

voltage source means connected to said bias line for providing a constant voltage thereto;

a semiconductor diode formed in said substrate and extending between said bias line and said floating gate electrode, said semiconductor diode comprising a first diffused region of the other type conductivity in said substrate defining a cathode connected to said bias line and a second diffused region of one type conductivity in said first diffused region defining an anode connected to said floating gate electrode to conductively connect said bias line and said floating gate electrode for setting the potential on said floating gate electrode;

means operable to apply voltages to said control gates in a manner transferring respective charge packets along the charge transfer channel to and away from a position under said floating gate electrode; and the potential on said floating gate electrode being changeable in response to a charge packet from the charge transfer channel being propagated thereunder for modulating the current flow in said transistor to produce an amplified output signal.

* * * * *